US005331119A

United States Patent [19]

Leger et al.

[11] Patent Number: 5,331,119

[45] Date of Patent: Jul. 19, 1994

[54] SPEAKER SUPPORT FRAME

[75] Inventors: Ricky D. Leger, Richmond; Jeffery J. Buchanan; Bill R. Unseld, both of Lexington, all of Ky.

[73] Assignee: Square D Company, Palatine, Ill.

[21] Appl. No.: 817,899

[22] Filed: Jan. 8, 1992

[51] Int. Cl.[5] .......... H05K 5/00

[52] U.S. Cl. .......... 181/150

[58] Field of Search .......... 181/148, 149, 150, 153, 181/171, 172, 174, 199; 381/87, 88, 188

[56] References Cited

U.S. PATENT DOCUMENTS 3,892,289 7/1975 Rollins .......... 181/150
4,860,369 8/1989 Koshimura et al. .......... 181/148 X

*Primary Examiner*—Russell E. Adams
*Assistant Examiner*—Khanh Dang
*Attorney, Agent, or Firm*—Larry I. Golden; Kareem M. Irfan

[57] ABSTRACT

A speaker support frame structure and optional cover for recessed mounting of a speaker in a wall or the like. The frame structure incorporates a one-piece, unitary molded frame body which has an open central region, a flattened perimeter region adjacent thereto, an adjacent peripheral upstanding shoulder region, and a terminal outwardly turned collar region. A speaker is nestably received thereon. Leg members are associated with a screw that extends through an orifice formed with the frame body. The leg members pivotally outswing and engage wall surfaces with adjustable clamping force. The frame body can be further provided with a frontal first ridge and also with a cover plate which has a rear second ridge so that the first and second ridge can engage mutually in a connecting relationship.

23 Claims, 1 Drawing Sheet

SPEAKER SUPPORT FRAME

FIELD OF THE INVENTION

This invention relates to an improved speaker support frame structure and optional cover for recessed mounting of a speaker in a wall or the like.

BACKGROUND OF THE INVENTION

Friedman Fr. Pat. No. 2,520,181 discloses a speaker support frame structure which is held across a mounting orifice preformed in a wall board (or wall panel) by means of screw pivoted clips. However, when a speaker is associated with this frame structure, only the rearward cylindrical portion of the speaker housing basket (which portion houses the speaker magnet) projects inwardly through the orifice. The remainder of the speaker housing basket (which remainder includes a conically tapered portion that houses the speaker cone and an outwardly turned frontal flange or rim that is used for speaker mounting) extends forwardly from the wall board. This forward extension is disadvantageous for many speaker installations.

Also, a flange of this Friedman frame structure outwardly extends adjacent to the forward side of the wall board at the orifice and is associated with screw clips. Each screw clip is provided with a leg portion that pivots outwardly to engage the rearward side of the wall board when its associated screw is turned. These legs must each be pivoted and wall board engaged to secure the frame structure to the wall board before a speaker is mounted upon the frame structure. Another disadvantage is that the speaker must be removed from the frame structure before the frame structure can be removed from the wall board. Also, with this frame structure, a speaker cannot be premounted thereto to reduce installation labor.

Further, with the Friedman frame structure, no speaker cover or grill is provided for association with peripheral portions of the frame structure after the speaker is mounted to the frame structure. In Friedman, a speaker grill is associated with the face of the speaker.

Koshimura U.S. Pat. No. 4,860,369 also discloses a screw clip wall mounted speaker support frame structure with the speaker here being of the flat type. The speaker mounts to the frame structure from the frame structure rear side so that the speaker cannot be separated from the frame structure unless the support frame is first completely detached from the associated wall board even for minor adjustment purposes which is very undesirable. Also, this frame structure prefers that a separate coiled compression spring member be associated with each screw clip subassembly evidently for purposes of biasing the clip leg member in a transversely spaced relationship relative to adjacent portions of the frame structure which adds to frame structure making and installation costs. Further, no cover member which overfits the support frame as well as the mounted speaker is provided.

The art needs a new and improved speaker support frame structure for the recessed wall mounting of a speaker. Preferably, the frame structure is independently engaged or disengaged with either the speaker or the wall board. Also, a cover grill for both the mounted speaker and the speaker support frame structure is optionally attached. The present invention provides such an improved speaker support frame structure and optional cover grill.

SUMMARY OF THE INVENTION

This invention provides a new and improved screw clip mounted speaker support frame structure for the recessed wall mounting of a speaker wherein the support frame structure is independently attached with either a wall board or a speaker.

The frame structure incorporates a frame body which is of one-piece, unitary, molded material, preferably plastic, and which is characterized by having an open central region, a flattened perimeter region adjacent thereto, an adjacent peripheral upstanding shoulder region, and a terminal outwardly turned collar region. A predetermined speaker is adapted to be nestably received within the shoulder region and to project inwardly through the central region with the speaker frontal rim abutting against, and being engagable with the perimeter region.

Preferably, the frame body further incorporates a plurality of unitarily molded pedestal means that transversely project inwardly from the back side of the frame body and that are individually located at perimetrically spaced intervals relative to each other in the perimeter region adjacent to the open central region. The pedestal means are useful for speaker mounting purposes when associated with screw means or the like.

A plurality of independent leg members are provided, one for each pedestal means, and each one thereof has a proximal end and a distal end. A plurality of screw means are also provided, one for each leg member. Each screw means extends through a different transversely extending aperture defined in the collar region and seats threadably in a proximal portion of each leg member. Stop means is unitarily molded with the frame body and situated adjacent each of the apertures.

The relationship between the leg members, the stop means, and the screw means is such that, when the frame structure is positioned about a preformed aperture in a wall board, and the respective individual screw means are turned, the distal portion of each leg member is pivoted from a storage position into engagement with the laterally adjacent back side of the wall panel so as to be transversely opposite a portion of the collar region. The stop means is appropriately situated to limit pivotal movement of an adjacent leg member at a desired position. Thereafter, the stop means permits continued turning of the associated screw means with the leg in a stationary position so as to tighten each leg member to a desired extent against the wall panel. Thereby, the wall panel is clamped between the distal portion of each leg member and adjacent transversely located portions of the collar region. As the tightening thus occurs, each screw means can deflect to a limited extent, thereby to enhance engagement of the frame structure with the wall panel about the aperture therein.

Preferably, the frame body in the outside face of its collar region is provided with first ridge means which more preferably extends at least about a portion thereof in laterally spaced relationship to the outer peripheral edge thereof. Also, a cover grill or cover plate is provided which is configured to extend over outside surface portions of the collar region of the frame body (and also the front face of a speaker that is mounted to the frame body). The cover grill is provided on at least portions of its back surface with second ridge means which more preferably extends in laterally spaced relationship to the outer peripheral edge thereof. The first and the second ridge means are adapted to make a mating connecting engagement with one another so that the cover grill is disengagingly connected over the speaker support frame structure.

The present invention also includes a speaker assembly for association with a preformed aperture in a wall board and for recessed mounting of a speaker. The assembly includes the frame structure described above, a speaker having a housing, and a cover plate over at least a substantial portion of the speaker.

Other and further objects, aims, features, advantages, purposes, embodiments, variations and the like will be apparent to those skilled in the art from the teachings of the present specification taken with the accompanying drawings and the appended claims.

DETAILED DESCRIPTION

Figure 1:
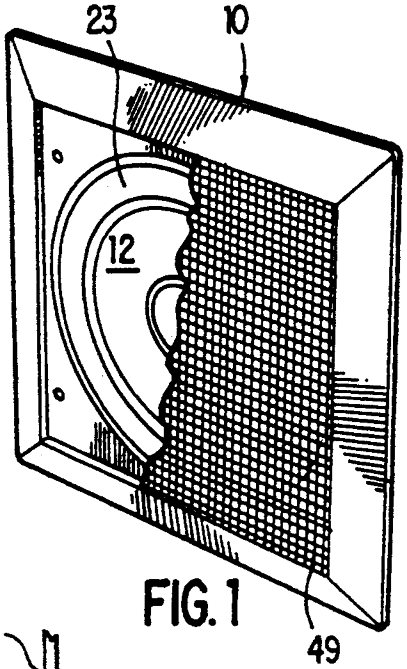
FIG. 1 is a perspective view of one embodiment of a speaker support frame structure of this invention which is shown in assembled combination with a speaker and with a cover grill.
Figure 2:
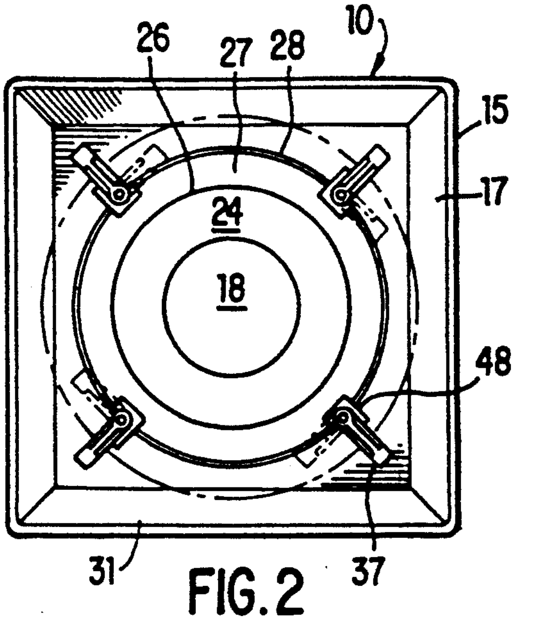
FIG. 2 is a rear elevational view of the embodiment shown in FIG. 1 with the leg members outwardly extended.
Figure 3:
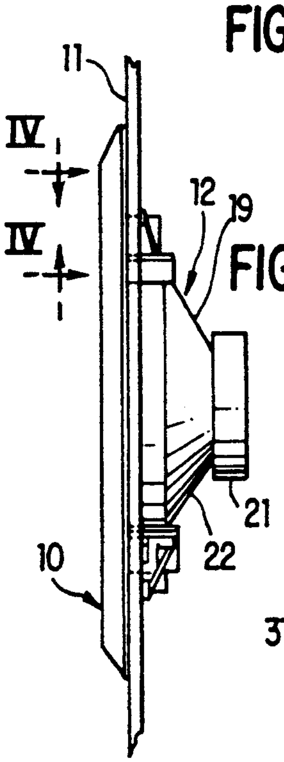
FIG. 3 is a side elevational view of the embodiment shown in FIG. 1 in association with a wall board and with the leg members outwardly extended.

Referring to the drawings, there is seen in FIGS. 1-6 an embodiment 10 of a speaker support frame structure of this invention that is in association with a wall board 11 in regions thereof that are laterally adjacent to an aperture 13 that is preformed in the wall board 11. A speaker 12 that is mounted in frame structure 10 is recessed into wall board 11 through aperture 13 as shown, for example, in FIG. 3. The wall board 11 need have no special composition.

Frame structure 10 incorporates a one-piece unitary, molded frame body 15 which is preferably comprised of plastic and which has a front side 16 and a back side 17. Also, body 15 has an open central region or aperture 18 which is adapted to receive therethrough body portions of the housing basket (or frame) 19 of speaker 12. These body portions include the portion 21 which houses the speaker magnet and the portion 22 which houses the conically tapered speaker cone. The basket 19 further includes an outwardly turned frontal flange or rim 23 that is used for speaker 12 mounting.

As those skilled in the art will appreciate, a frame structure 10 can be adapted and configured for usage with a wide variety of different speaker structures. Although a speaker with a cross-sectionally circular shape (proceeding rearwardly from the frontal flange) is illustratively shown, other speaker shapes can be utilized and a single speaker assembly can involve more than one speaker cone. For example, a single speaker assembly can involve two or more associated speakers, each one of which is adapted to reproduce sound over a particular predetermined frequency range (not illustrated). Thus, instead of the circular configuration shown, the central aperture region 18 can have another configuration which is particularly well adapted for receipt therethrough of a particular speaker assembly, such as a square or rectangular perimeter configuration.

The body 15 has a flattened perimeter region 24 which extends about the central aperture region 18. Perimeter region 24 has an outer face that is adapted to make abutting engagement with back side regions of the rim 23.

The body 15 also has a first shoulder region 26 that upstands frontally from and extends peripherally about the perimeter region 24. Preferably, the shoulder region 26 is in a laterally adjacent relationship to the periphery of rim 23.

Figure 4:
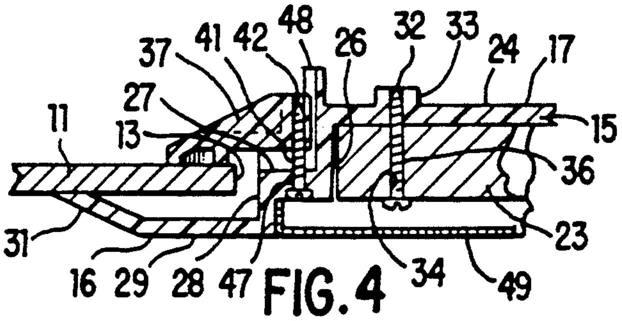
FIG. 4 is an enlarged fragmentary transverse sectional view taken along the line IV—IV of FIG. 3.
Figure 5:
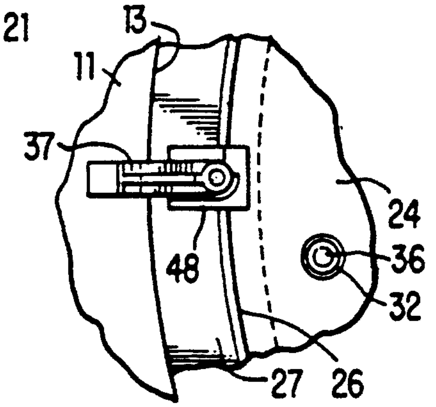
FIG. 5 is an enlarged fragmentary plan view of the rear region of the embodiment shown in FIG. 1 taken in the vicinity of the view shown in FIG. 4.
Figure 6:
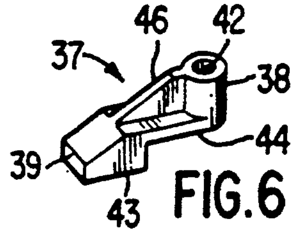
FIG. 6 is a perspective view of one leg member that is incorporated into the embodiment shown in FIGS. 1-5.

The body 15 further has an outwardly turned, flattened first collar region 27 that extends peripherally about the shoulder region 26. In a preferred embodiment, as shown in FIG. 4, first collar region 27 is inset relative to aperture 13.

The body 15 further has a second shoulder region 28 that upstands frontally from and peripherally about the first collar region 27, and also a flattened second collar region 29 that extends peripherally about the second shoulder region 28. Peripheral outer edge portions 31 of second collar region 29 are angled backwardly and are adapted to make contact with exterior side portions of the wall board 11 in laterally spaced relationship to the aperture 13 in wall board 11. The perimeter configuration of outer portions 31 can be as desired, including the square configuration illustratively shown for embodiment 10, or otherwise, such as rectangular or circular. The configuration of the outer portions 31 need not be related to the configuration of a given speaker, or to the shape of a given aperture 18, as those skilled in the art will readily appreciate. Preferably, the size of the aperture 13 is slightly greater than the size of the second shoulder region 28 so that the frame structure 10 is generally loosely accommodated by the aperture 13.

The perimeter region 24 has a plurality of apertures 32 defined therein which extend transversely therethrough. The individual apertures 32 are located substantially in the perimeter region 24 at perimetrically spaced intervals (preferably equal) that are located about, and are adjacent to, the shoulder region 26 and also to the aperture 18. The number of apertures 32 can preferably be in the range from about 3 to about 5, and most preferably is about 4, but more or less apertures 32 can be used if desired.

The perimeter region 24 is preferably transversely thickened in the region of each aperture 32. For example, the perimeter region 24 is provided with a plurality of pedestal projections 33 that transversely upstand from the back side 17 of the body 15. The individual pedestal projections 33 are located substantially in the perimeter region 24 at perimetrically spaced intervals (preferably equal) that are about and adjacent to the shoulder region 26 and also to the aperture 18. When the pedestal projections 33 are provided, each one of the apertures 32 is located (preferably centrally) in a different projection 33 as shown in FIG. 4.

The apertures 32 are located so as to be alignable with respective holes 34 that extend transversely through the rim 23 of speaker 12 at spaced intervals. Thus, the speaker 12 is mounted to frame body 15 by aligning the holes 34 with the apertures 32 and extending a screw 36 through each hole 34 for threadable engagement with an adjacent apertures 32 such as shown in FIG. 4. The height of the first shoulder region 26 is preferably about equal to the thickness for the rim 23.

The frame structure 10 is provided with plurality of leg members 37 which are adapted to be located at permetrically spaced intervals (preferably equal) about first collar 27. Each leg member 37 has a proximal portion 38 and a distal portion 39.

The first collar region 27 in embodiment 10 has defined therein a plurality of orifices 41 which each extend transversely therethrough. The individual orifices 41 are located at perimetrically spaced intervals (preferably equal) in first collar region 27. The number of orifices 41 is preferably equal to the number of leg members 32. Preferably from three to five such leg members 37 are utilized in embodiment 10, although more or less thereof can be used, if desired. Most preferably, four leg members 37 are used for a structure 10 as shown.

A channel 42 that transversely extends through the proximal region 38 of each leg member 37 is provided. Also a foot pad 43 that upstands from the distal region 39 of each leg member 37 is provided. Each leg member 37 is preferably a one-piece, unitary, molded body which is preferably comprised of plastic. To provide rigidity and strength for the structure of the leg member 37, the proximal portion 38 is interconnected in longitudinally spaced relationship to the distal portion 39 by a laterally flattened rib 44 that is also in unitary combination with a vertically upstanding rib 46 that extends along a longitudinal mid-section of rib 44.

In the assembled configuration, each leg member 37 is positioned so that its channel 42 is in aligned relationship with a different orifice 41. A plurality of screws 47 are provided and each screw 47 is extended through each orifice 41 and is threadably engaged with the channel 42 of the respective leg member 37. Before frame structure association with wall board 11 is accomplished, the leg members 37 are arranged in a tangential relationship on the back side of first collar region 27 relative to and adjacent first shoulder region 26, thereby to achieve storage therefor. The storage configuration is shown by dotted lines in FIG. 2 for each leg member 37. When the frame body 15 is positioned in an aperture 13 and each screw 47 is turned from a front side 16 location, each respective leg member 37 is pivoted about its proximal portion 38, thereby swinging its distal portion 39 outwardly away from first shoulder region 26 and bringing the distal portion 39 into overlying and adjacent relationship with the interior surface of the wall board 11 so that its foot pad 43 is engagable with such surface.

To position and regulate the location of each leg member's distal portion 39 in an outwardly orientation, the frame body 15 is provided with a plurality of unitarily formed stop projections 48. Each stop projection 48 extends transversely inward from the back side of first collar region 27 adjacent each orifice 41. The preferred orientation of the leg member's distal portion 39 is generally perpendicular relative to the adjacent local periphery of the first collar region 27. In the preferred embodiment, wherein the screws 47 each threadably engage and advance by clockwise rotational turning movement (and disengage by a counterclockwise corresponding reverse movement), each stop projection is located so as to be on the right side of each associated advancing screw 47 in each orifice 41 (or, when looking at the back side 17 of frame body 15 as in FIG. 5 on the left side of each such screw 47). Each stop projection 48 is further positioned so as to abut against a side portion of each leg member 37 when the leg member 37 becomes oriented perpendicularly to the local peripheral edge portion of first collar region 27.

Once such abutting engagement of a leg member 37 with a stop projection 48 is achieved, the associated screw 47 can be turned clockwise further to draw the associated foot pad 43 into a tightened engagement with the adjacent portion of wall board 11. The interrelationship between each leg member 37, first collar region 27, associated screw 47, second shoulder region 28, second collar region 29 and wall board 11 is preferably such that, in a tightened configuration, the resulting assembly has the appearance generally shown in FIG. 4 where each foot pad 43 fully engages an interior surface portion of wall board 11 and the peripheral outer portions 31 of second collar region 29 fully engage the exterior surface portions of wall board 11. A yielding bias is thus achieved which urges the frame structure 10 into engagement with the wall board 11 portions about the orifice 13. To aid in achieving and maintaining this bias, the individual screws 47 can slightly cant or tilt relative to first collar region 27 each in its respective orifice 41 in the tightened configuration. The frame body 15 is demounted from a wall board 11 by following the reverse procedure.

Thus, the frame body 15 is mounted to the wall board 11 separately and independently of the mounting of the speaker 12 to the frame body 15. For example, a speaker 12 can be mounted or demounted from frame body 15 with or without the frame body 15 being mounted to a wall board 11.

When the frame body 15 has been thus mounted in an aperture 13 in a wall board 11, whether or not a speaker 12 is mounted to the frame body 12, an optional but preferred cover grill or cover plate 49 is provided which insets over the frame body 15. For example, in the embodiment 10, the cover grill 49 is formed of a relatively rigid wire mesh or the like whose side edge adjacent portions are inwardly turned and sized to fit as an inset into frame body 15 along the front sides of the second shoulder region 28 with the edge portions of the grill 49 resting against the front side of the first collar region 27. Thus, if desired, a frame structure 10 can be mounted to a wall board 11 and covered for aesthetic reasons with the cover grill 49 even though no speaker 12 is yet been mounted on the frame structure 10.

Figure 7:
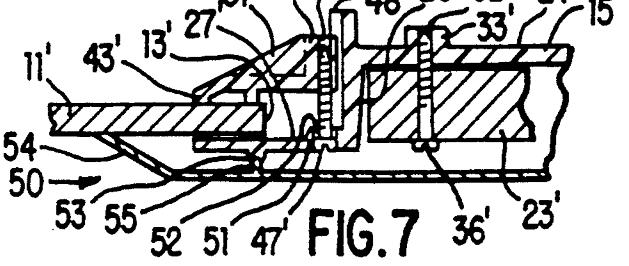
FIG. 7 is a view similar to FIG. 4, but illustrating an alternative embodiment of a speaker support frame structure of this invention.

The second shoulder region 28 and the second collar region 29 can be regarded as optional but preferred components of a speaker support frame structure of the invention. For example, referring to FIG. 7, there is seen an alternative embodiment 50 of a speaker support frame structure of this invention. Components of embodiment 50 that are similar to corresponding components in embodiment 10 are identically numbered but with the addition of prime marks thereto.

Embodiment structure 50 is in association with a wall board 11' and a speaker rim 23'. Structure 50 incorporates a one piece, unitary molded frame body 15' which has a flattened perimeter region 24' that exists about an aperture 18' (not shown) in the body 15'. Body 15' has a shoulder region 26' that upstands frontally from and that extends peripherally about the perimeter region 24'. Body 15' also has an outwardly turned collar region 27′ that extends peripherally about the shoulder region 26′. The peripheral edge region of collar region 27′ abuts against the exterior surface portions of wall board 11′ adjacent to the aperture 13′ therein. The speaker rim 23′ is mounted to the perimeter region 24′ by means of screws 36′ which are threadably received in aperture 32′ which extend through a terminal pedestal projection 33′ of perimeter region 24′.

A plurality of projections 51 transversely upstand from the back side of the outwardly turned collar region 27′. The projections 51 are located at perimetrically spaced intervals about and adjacent to the shoulder region 54. The projections 51 have a transversely extending channel 52 formed therein. A stop projection 48′ is unitarily formed with the frame body 15′ and extends transversely inward from the back side of the collar region 27′.

A leg member 37′ is positioned with its proximal end 38′ over each projection 51 and with its channel 42′ aligned with the adjacent channel 52. A screw 47′ is then extended through each of the channels and is threadably engaged with the respective channel 42′. Thus, each leg member 37′ is pivotable outward from a rest position to an engaged position with wall board 11′, analogously to the arrangement achieved in embodiment 10. Thus, each leg member 37′ is transversely spaced from the collar region 27′ by the projection 51 and screw 47′. The height of projection 51 and length of the screw 47′ are preferably determined so that the spacing between the back side of the collar regions 27′ and the foot pad 43′ of each leg member 37′ in the assembled and mounted configuration is about equal to the thickness of the wall board 11′.

A ridge 53 is provided on the front side of collar region 27′ and preferably extends about collar region 27′ in inwardly spaced relationship to the outside edge thereof. A separate cover grill 54 is also provided that is itself provided with another ridge 55. The ridge 55 is engagable with the ridge 53 to achieve a snap-fit type of engagement between the cover grill 54 and frame body 15′.

The present invention contemplates the use of other means for disengagingly attaching a cover plate to the frame body. For example, the perimeter region can include orifices or holes to frictionally accommodate a male prong in a press fit arrangement. The male prong is attached to the cover plate. Any fastener arrangement for attaching the cover plate to the frame body is suitable.

Although the invention has been described in reference to particular embodiments and applications, the invention is susceptible to other applications which will be apparent to those skilled in the art.

What is claimed is:

1. A speaker support frame structure for association with a preformed aperture in a wall board and for recessed mounting of a speaker having a housing, the frame structure comprising:

(A) a one-piece, unitary, molded frame body having a front side and a back side and also having:

(1) an open central region for receiving therethrough body portions of the speaker housing, (2) a flattened perimeter region extending about the open central region the perimeter region having a front side adapted for making abutting engagement with the speaker housing, (3) a shoulder region upstanding frontally from and extending peripherally about the perimeter region, the shoulder region being adjacent to the speaker housing, (4) an outwardly turned collar region extending peripherally about the shoulder region, the collar region adjusted for contacting the exterior side of the wall board adjacent the preformed aperture, (5) a plurality of orifice means that are individually located in the collar region at perimetrically spaced intervals about and adjacent to the shoulder region, and (6) a plurality of stop means, one stop means being adjacent each orifice means;

(B) a plurality of leg members, one for each of the orifice means, each leg member having a proximal portion and a distal portion; and (C) a plurality of screw means, one for each of the orifice means, each screw means extending through a different one of the orifices and threadably engaging the proximal portion of a different one of the leg members; so that, when the frame body is positioned in the preformed aperture, each one of the screw means can be rotated to pivot its associated leg member outwardly into abutting engagement with the adjacent stop means and with the leg member distal portion yieldingly engaging the interior side of the wall board, thereby clamping the wall board between the leg members and transversely adjacent portions of the collar region.

2. The frame structure of claim 1 wherein the perimeter region further includes a second plurality of orifices perimetrically spaced and adjacent to the open central region, each of the second plurality of orifices adapted to threadingly engage with a second plurality of screw means to allow the abutting engagement of the perimeter region with the speaker housing.

3. The frame structure of claim 2 wherein the cross-sectional thickness of the perimeter region is increased adjacent to each of the second plurality of orifices to provide an improved threadable engagement with the second plurality of screw means.

4. The frame structure of claim 1 wherein the front side of the frame body further includes means for disengagingly attaching a cover plate to the frame body.

5. The frame structure of claim 4 wherein the attachment means includes a plurality of holes for receiving a male prong, the holes being located in the perimeter region, each of the holes adapted to frictionally attach to a respective male prong in a press fit arrangement.

6. The frame structure of claim 1 wherein the outwardly turned collar region further has defined therein first abutment means, and wherein a cover plate for the frame body is provided, the cover plate having a perforated grill-like central portion and further having second abutment means, the first and the second abutment means are adapted to disengagingly connect with one another so that the cover plate is mountable against the outwardly turned collar region.

7. The frame structure of claim 6 wherein the first abutment means extends at least about a portion of the collar region in laterally spaced relationship to the outer peripheral edge thereof and wherein the second abutment means extends at least about a portion of the cover plate in laterally spaced relationship to the outer peripheral edge thereof.

8. The frame structure of claim 1 wherein the collar region has unitarily associated therewith a plurality of outstanding projection means on the back side thereof, the projection means being located in perimetrically spaced relationship relative to one another with each one being about a different one of the orifice means, so that each one of the leg members is transversely spaced from the collar region.

9. The frame structure of claim 8 wherein the cross-sectional thickness of the collar region is increased in the area adjacent to each of the orifice means to provide improved threadable engagement with the screw means.

10. The frame structure of claim 1 wherein each of the screw means is slightly tiltable within each orifice and each leg member's proximal portion.

11. The frame structure of claim 1 wherein the collar region has a second shoulder region upstanding frontally from and extending peripherally about the collar region, the second shoulder region having a second outwardly turned collar region extending peripherally thereabout.

12. The frame structure of claim 11 wherein the second outwardly turned collar region has an outer peripheral edge region which is turned inward.

13. A speaker assembly for association with a preformed aperture in a wall board and for recessed mounting of a speaker, the assembly comprising:

(A) a speaker having a housing;

(B) a one-piece, unitary, molded frame body having a front side and a back side and also having:

(1) an open central region for receiving therethrough body portions of the speaker housing, (2) a flattened perimeter region extending about the open central region the perimeter region having a front side adapted for making abutting engagement with the speaker housing, (3) a shoulder region upstanding frontally from and extending peripherally about the perimeter region, the shoulder region being adjacent to the speaker housing, (4) an outwardly turned collar region extending peripherally about the shoulder region, the collar region adjusted for contacting the exterior side of the wall board adjacent the preformed aperture, (5) a plurality of orifice means that are individually located in the collar region at perimetrically spaced intervals about and adjacent to the shoulder region, and (6) a plurality of stop means, one stop means being adjacent each orifice means;

(C) a plurality of leg members, one for each of the orifice means, each leg member having a proximal portion and a distal portion;

(D) a plurality of screw means, one for each of the orifice means, each screw means extending through a different one of the orifices and threadably engaging the proximal portion of a different one of the leg members, so that, when the frame body is positioned in the preformed aperture, each one of the screw means can be rotated to pivot its associated leg member outwardly into abutting engagement with the adjacent stop means and with the leg member distal portion yieldingly engaging the interior side of the wall board, thereby clamping the wall board between the leg members and transversely adjacent portions of the collar region; and (E) a cover plate for the assembly, the cover plate having a perforated grill-like central portion covering at least a substantial portion of the speaker and means for disengagingly attaching the cover plate to the frame body.

14. The frame structure of claim 13 wherein the perimeter region further includes a second plurality of orifices perimetrically spaced and adjacent to the open central region, each of the second plurality of orifices adapted to threadingly engage with a second plurality of screw means to allow the abutting engagement of the perimeter region with the speaker housing.

15. The frame structure of claim 14 wherein the cross-sectional thickness of the perimeter region is increased adjacent to each of the second plurality of orifices to provide an improved threadable engagement with the second plurality of screw means.

16. The frame structure of claim 13 wherein the attachment means further includes first abutment means defined on the outwardly turned collar, the cover plate having second abutment means, the first and the second abutment means are adapted to disengagingly connect with one another so that the cover plate is mountable against the outwardly turned collar region.

17. The frame structure of claim 16 wherein the first abutment means extends at least about a portion of the collar region in laterally spaced relationship to the outer peripheral edge thereof and wherein the second abutment means extends at least about a portion of the cover plate in laterally spaced relationship to the outer peripheral edge thereof.

18. The frame structure of claim 13 wherein the collar region has unitarily associated therewith a plurality of outstanding projection means on the back side thereof, the projection means being located in perimetrically spaced relationship relative to one another with each one being about a different one of the orifice means, so that each one of the leg members is transversely spaced from the collar region.

19. The frame structure of claim 18 wherein the cross-sectional thickness of the collar region is increased in the area adjacent to each of the orifice means to provide an improved threadable engagement with the screw means.

20. The frame structure of claim 13 wherein each of the screw means is slightly tiltable within each orifice and each leg member's proximal portion.

21. The frame structure of claim 13 wherein the collar region has a second shoulder region upstanding frontally from and extending peripherally about the collar region, the second shoulder region having a second outwardly turned collar region extending peripherally thereabout.

22. The frame structure of claim 21 wherein the second outwardly turned collar region has an outer peripheral edge region which is turned inward.

23. A speaker support frame structure for association with a preformed aperture in a wall board or the like and for recessed mounting of a speaker, the frame structure comprising:

(A) a one-piece, unitary, molded frame body having a front side and a back side and also having:

(1) a collar region adapted for attachment with a speaker and extending peripherally about the associated speaker, the collar region adapted for contacting the exterior side of the wall board adjacent the preformed aperture, and (2) a plurality of orifice means that are individually located in the collar region at perimetrically spaced intervals;

(B) a plurality of leg members, one for each of the orifice means, each leg member having a proximal portion and a distal portion;

(C) a plurality of screw means, one for each of the orifice means, each screw means extending through one of the orifices and threadingly engaging the proximal portion of one of the leg members so that when the frame body is positioned in the preformed aperture, each screw means can be rotated to pivot its associated leg member outwardly into abutting engagement between the distal portion thereof and the interior side of the wall board, thereby clamping the wall board between the leg members and transversely adjacent portions of the collar region; and (D) the front side of the frame, the speaker, and the pluralities of orifices and screw means being adapted to disengagingly mount a cover thereover; and the wall board being provided with a first abutment means, and a cover being provided for the front side of the frame, the associated speaker, and the pluralities of orifices and screw means, the cover having a second abutment means, the first and second abutment means are adapted to disengagingly connect with one another so that the cover is mountable against the wall board.

* * * * *